United States Patent [19]

Bartholet

[11] 4,179,597
[45] Dec. 18, 1979

[54] CONTINUOUS THRU-WIRE WELDING MACHINE

[75] Inventor: Stephen J. Bartholet, Orange, Calif.

[73] Assignee: Odetics, Inc., Anaheim, Calif.

[21] Appl. No.: 929,735

[22] Filed: Jul. 31, 1978

[51] Int. Cl.² .......................... B23K 11/00; B23K 9/28
[52] U.S. Cl. ................................ 219/56.1; 219/86.51; 228/237
[58] Field of Search ................. 219/56.1, 56.21, 56.22, 219/58, 85 F, 85 G, 86.23, 86.25, 86.33, 86.41, 86.51, 86.61, 91.21, 92; 228/233, 236, 237, 243

[56] References Cited

U.S. PATENT DOCUMENTS

| | | | |
|---|---|---|---|
| 1,749,719 | 3/1930 | Reiter et al. | 219/85 G |
| 2,906,334 | 9/1959 | Peters | 219/56.1 X |
| 3,860,782 | 1/1975 | Hamby | 219/85 F X |
| 3,912,899 | 10/1975 | Lehmann et al. | 219/69 W |
| 3,912,900 | 10/1975 | Arnett | 219/58 X |

Primary Examiner—Bruce A. Reynolds
Assistant Examiner—Keith E. George
Attorney, Agent, or Firm—Philip M. Hinderstein

[57] ABSTRACT

A machine for welding a conductor to a terminal in which a pair of elongated conductive electrodes having adjacent ends are mounted for axial movement toward and away from each other on opposite sides of the terminal. The opposite ends of a cable are attached to the electrodes for moving same toward the terminal. A motor applies a tension force to the cable and a sensor operatively coupled to the cable senses the tension force therein and generates an electrical signal proportional thereto. This signal is compared to another electrical signal proportional to the desired force between the electrodes and the terminal and the difference signal is utilized to control the motor.

11 Claims, 8 Drawing Figures

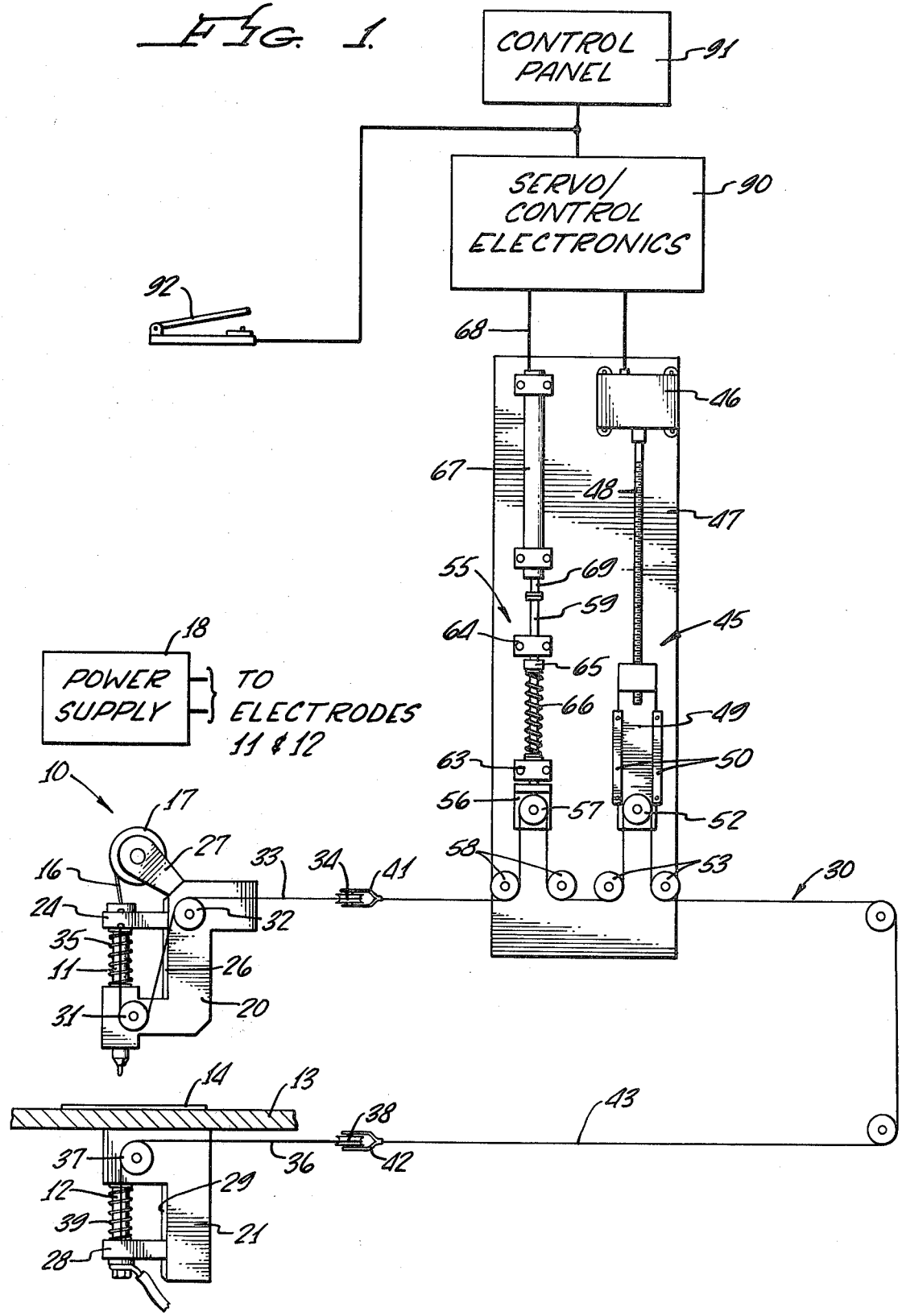

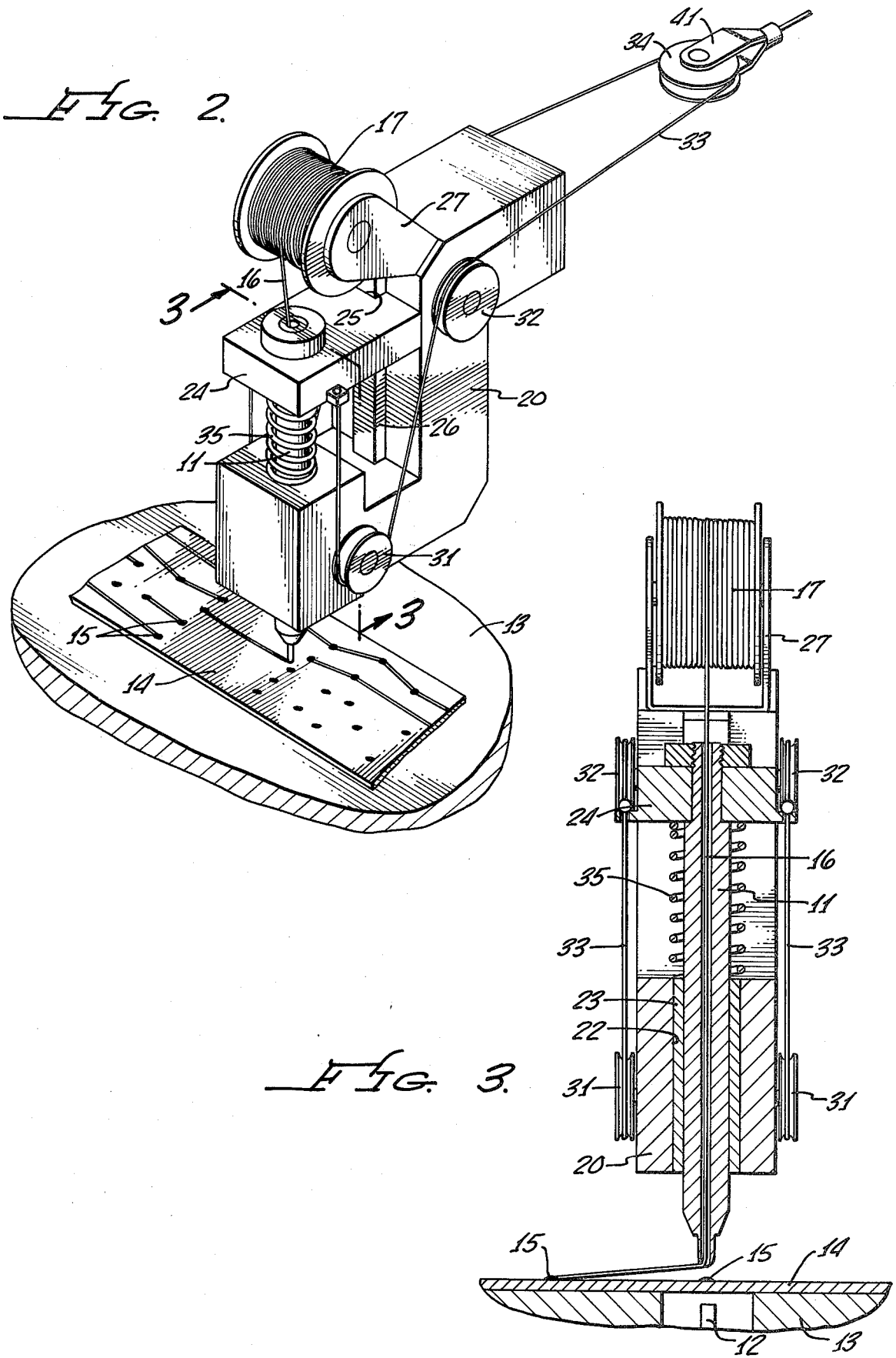

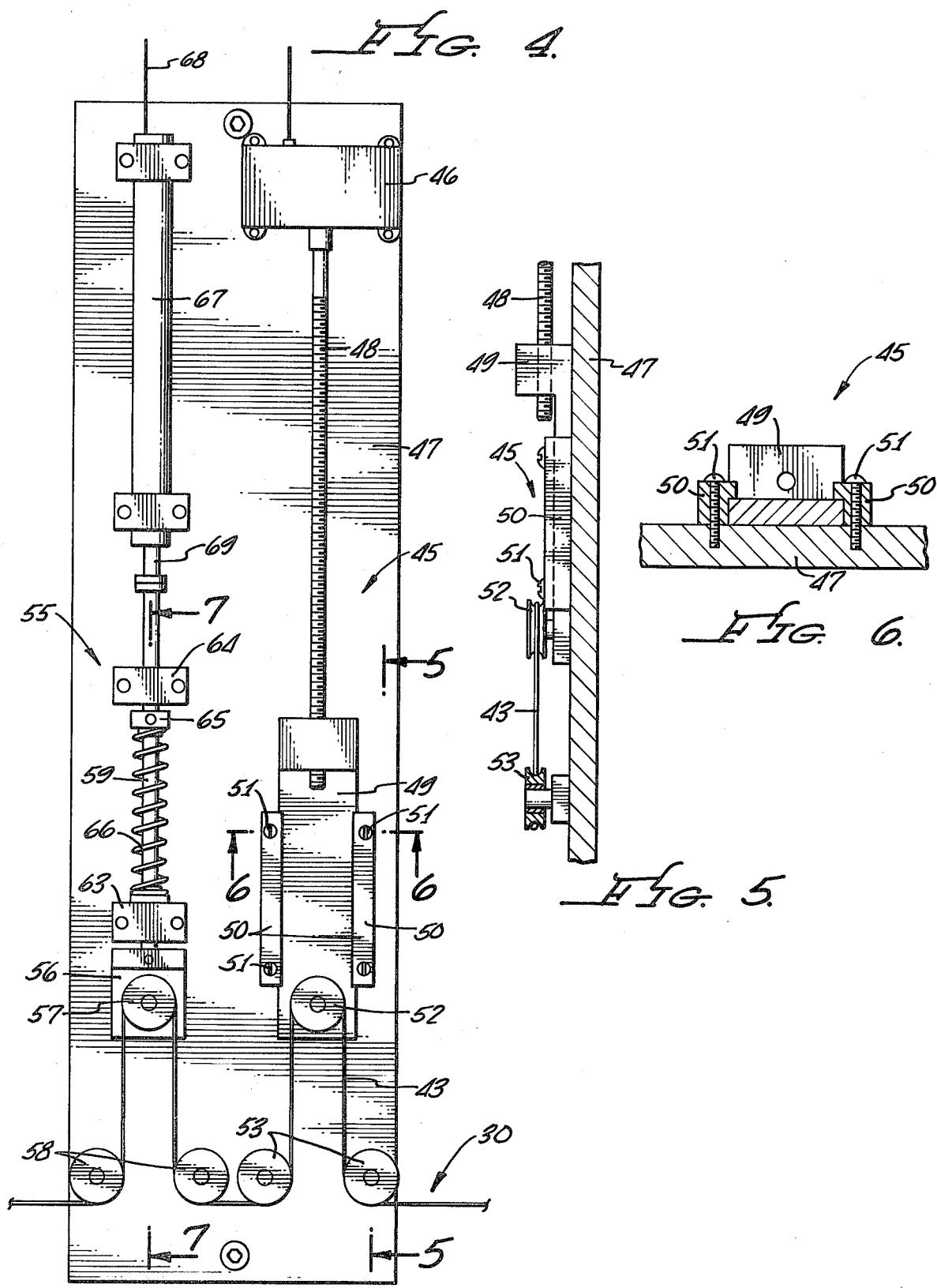

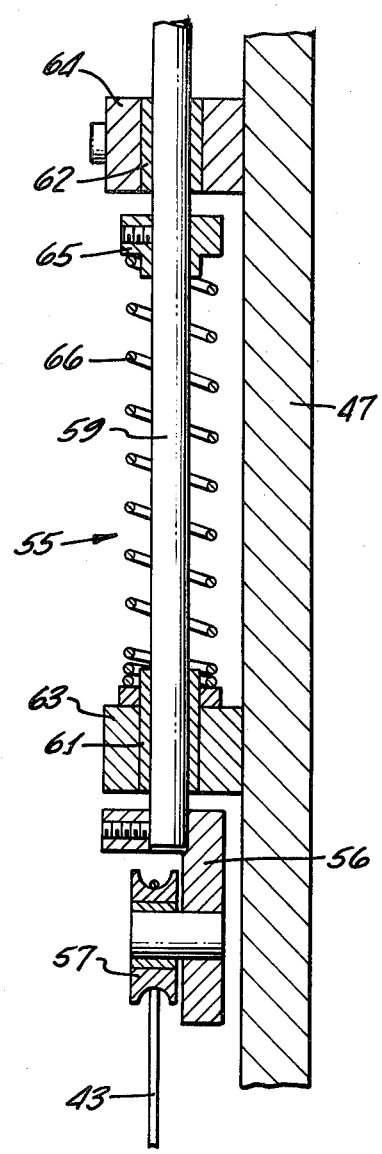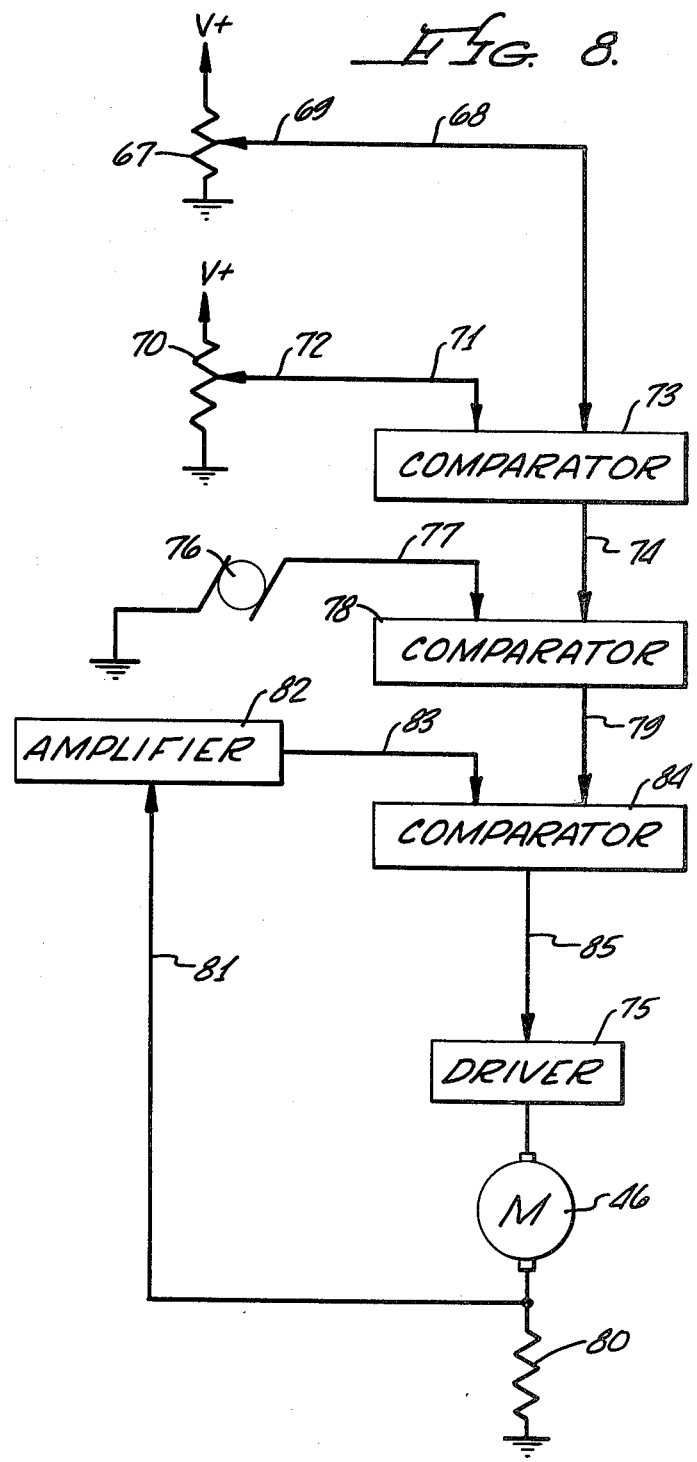

CONTINUOUS THRU-WIRE WELDING MACHINE

BACKGROUND OF THE INVENTION

1. Field of the Invention

The present invention relates to a continuous thru-wire welding machine and, more particularly, to a highly simplified welding machine having a repeatable, accurately controllable welding force.

2. Description of the Prior Art

Complex electronic assemblies include large numbers of closely spaced, miniature terminals which must be electrically interconnected. This is achieved simply and conveniently by the use of a continuous insulated wire, typically nickel coated with teflon. As is known in the art, the continuous insulated wire is snaked to individual terminal locations without the need of removing the insulation prior to assembling the wire for welding. Rather, advantage is taken of the cold-flow properties of teflon.

Specifically, a pair of elongated conductive electrodes having adjacent ends are mounted for movement toward the terminal. Either the electrodes can be concentric with a dielectric therebetween or the electrodes can be positioned in coaxial, spaced relationship and movable toward and away from each other. Typically, one electrode is hollow and the wire is continuously fed therethrough. When a connection is desired, the electrodes are moved into contact with the terminal. Pressure is applied between the electrode and the terminal to break through the teflon insulation. Thereafter, an electrical pulse is applied to the electrodes, which pulse causes a diffusion bond to occur at the junction of the wire and the terminal. The electrodes are then positioned consecutively to all of the other common points in a given signal string.

During such a process, it is desirable and, in fact, necessary, to accurately control the force on the wire positioned between the terminal and the electrodes. That is, if the force is too low, one does not achieve cold-flow of the teflon insulation and a good bond cannot be achieved. If the force is too high, the electrode will damage the wire. The result is a necessity to control the force within narrow limits. In the past, welding machines have utilized complex and expensive pneumatic, hydraulic, or mechanical means for varying the pressure between the welding electrodes and the terminal. Most importantly, these machines have proven incapable of providing a repeatable, accurately controllable welding force.

SUMMARY OF THE INVENTION

According to the present invention, these problems are solved by providing a novel continuous thru-wire welding machine. The present welding machine provides a repeatable, accurately controllable welding force through the use of an electromechanical actuator mechanism. The present welding machine does not attempt to apply a set force to the electrodes. Rather, the present machine applies a force and continuously and accurately senses the force being applied. The difference between a desired force and the actually applied force is utilized to continue to operate the force applier. A feedback loop stops the force application when the sensed force reaches the desired force level. The force is adjustable over a wide range and can be sequenced in any order.

The present system provides more accuracy, more uniformity, and more flexibility than known systems. For example, it does not require an external supply of compressed air with the attendant pressure fluctuation and filtration problems involved in existing pneumatic systems. The electrode actuator can be controlled both in velocity and force and it interfaces easily with existing electronic control systems.

Briefly, the present welding machine for welding a conductor to a terminal comprises a pair of elongate conductive electrodes having adjacent ends mounted for axial movement toward the terminal, a cable, means for attaching the cable to the electrodes for moving same toward the terminal, drive means operatively connected to the cable for applying a tension force thereto, input means for establishing a predetermined force between the electrodes and the terminal and for generating a first electrical signal proportional thereto, sensing means operatively coupled to the cable for sensing the tension force therein and for generating a second electrical signal proportional thereto, comparison means for comparing the first and second signals and for generating a third electrical signal as a function of the comparison, and control means responsive to the third signal for controlling the drive means.

OBJECTS

It is therefore an object of the present invention to provide a continuous thru-wire welding machine.

It is a further object of the present invention to provide a highly simplified, continuous, thru-wire welding machine having a repeatable, accurately controllable welding force.

It is a still further object of the present invention to provide a continuous thru-wire welding machine utilizing an electromechanical actuator mechanism.

It is another object of the present invention to provide a continuous thru-wire welding machine utilizing a servo-controlled feedback loop for controlling the electrode force.

Still other objects, features, and attendant advantages of the present invention will become apparent to those skilled in the art from a reading of the following detailed description of the preferred embodiment constructed in accordance therewith, taken in conjunction with the accompanying drawings wherein like numerals designate like or corresponding parts in the several figures and wherein:

BRIEF DESCRIPTION OF THE DRAWINGS

FIG. 1 is an overall diagramatic view of a continuous thru-wire welding machine constructed in accordance with the teachings of the present invention;

FIG. 2 is an exploded perspective view of a portion of the head assembly of the welding machine of FIG. 1;

FIG. 3 is an enlarged sectional view taken along the line 3—3 in FIG. 2;

FIG. 4 is a plan view of the drive and sensing means of the welding machine of FIG. 1;

FIGS. 5, 6, and 7 are enlarged sectional views taken along the lines 5—5, 6—6, and 7—7, respectively, in FIG. 4; and FIG. 8 is a block diagram of the electrical portion of the welding machine of FIG. 1.

DESCRIPTION OF THE PREFERRED EMBODIMENT

Referring now to the drawings and, more particularly, to FIGS. 1-3 thereof, there is shown a continuous thru-wire welding machine, generally designated 10, having a number of elements common to conventional thru-wire welding machines. Specifically, welding machine 10 includes a pair of elongated conductive electrodes 11 and 12 having adjacent ends mounted for axial movement toward and away from each other. Positioned between electrodes 11 and 12 is a work table 13 on which may be mounted a circuit board 14 having a number of terminals 15. Terminals 15 are electrically interconnected by use of continuous insulated wire 16 mounted on a spool 17. Wire 16 may conveniently be nickel coated with teflon. As is known in the art, wire 16 is snaked to individual terminals 15 without the need of removing the insulation prior to assembling the wire for welding.

Electrode 11 is hollow and wire 16 is conducted from spool 17 therethrough. When a connection is desired, electrodes 11 and 12 are moved into contact with opposite sides of a terminal 15. Pressure is applied between electrodes 11 and 12 and the terminal 15, as will be described more fully hereinafter, to break through the teflon insulation. Thereafter, an electrical pulse is applied to electrodes 11 and 12 from a power supply 18. The electrical pulse causes a diffusion bond to occur at the junction of wire 16 and terminal 1 5. It is the purpose of the present invention to accurately control the force that electrodes 11 and 12 place on wire 16 and terminal 15.

Welding machine 10 includes upper and lower stationary supports 20 and 21, respectively, which are rigidly conneted to work table 13. Upper support 20 includes a bore 22 which supports a bearing 23 which supports for axial movement electrode 11. The upper end of electrode 11 is connected to a movable carriage 24 having a groove 25 for receipt of a tongue 26 connected to support 20 for guiding carriage 24. Spool 17 is connected by means of a bracket 27 to support 20 whereby spool 17 is supported directly above carriage 24.

Although not shown in the same detail, the construction of lower electrode 12 and lower support 21 is similar. Lower electrode 12 is secured to a movable carriage 28 which is guided by a tongue 29 connected to lower support 21.

Electrodes 11 and 12 are driven by a cable assembly, generally designated 30, which is attached to electrodes 11 and 12 for simultaneously moving same towards circuit board 14. As shown in FIG. 2, first and second pairs of coaxial pulleys 31 and 32, respectively, are connected on opposite sides of support 20. A first cable section 33 extends from one side of movable carriage 24, around one set of adjacent pulleys 31 and 32, around a pulley 34, around the other set of adjacent pulleys 32 and 31, to the opposite side of movable carriage 24. Accordingly, and as should be obvious from an inspection of FIG. 2, a force on pulley 34 in a direction away from support 20 applies a force to cable section 33 which is applied equally to opposite sides of movable carriage 24 to force movable carriage 24 downwardly. Movable carriage 24 is biased upwardly by a spring 35.

A similar arrangement is provided for movement of lower electrode 12. That is, a second cable section 36 has its opposite ends connected to movable carriage 28 and then extends around a pair of coaxial pulleys 37 positioned on opposite sides of lower support 21. The central portion of cable section 36 engages a pulley 38. Electrode 12 is biased downwardly by a spring 39.

Pulleys 34 and 38 are connected to brackets 41 and 42, respectively, which are connected to the opposite ends of a cable section 43 of cable assembly 30. Welding machine 10 also includes drive means, generally designated 45, which is operatively connected to cable section 43 of cable assembly 30 for applying a tension force to cable assembly 30. As will be obvious, the application of such a tension force is transmitted equally to pulleys 34 and 38 and then to cable section 3 and 36 for movement of electrodes 11 and 12 with equal and opposite forces.

Referring now to FIGS. 1 and 4-6, drive means 45 comprises a motor 46 mounted on a support 47 which is fixed relative to supports 20 and 21. Motor 46 has a rotatable output shaft 48 which is threaded to function as a drive screw. Shaft 48 engages a movable carriage 49 having an internally threaded hole for receipt and engagement of the threads on shaft 48. Carriage 49 is mounted for longitudinal movement between a pair of guides 50 secured to support 47 by screws 51. Mounted on carriage 49 is a pulley 52 around which cable section 43 of cable assembly 30 extends. Also mounted on support 47 are a pair of stationary pulleys 53 which direct cable section 3 to pulley 52. Accordingly, activation of motor 46 and rotation of drive screw 48 moves movable carriage 49 and pulleys 52 to apply a tension force to cable assembly 30.

Referring now to FIGS. 1, 4, and 7, welding machine 10 further includes sensing means, generally designated 55, operatively coupled to cable assembly 30, for sensing the tension force therein and for generating an electrical signal proportional thereto. Sensing means 55 includes a movable carriage 56 on which is mounted a pulley 57 around which extends cable section 43 of cable assembly 30. A pair of fixed pulleys 58 mounted on support 47 conduct cable section 43 to pulley 57. Connected to one end of movable carriage 56 is an elongate shaft 59. Shaft 59 extends through bearings 61 and 62 in fixed pillow blocks 63 and 64, respectively, pillow blocks 63 and 64 supporting shaft 59 for axial movement. Mounted on shaft 59 is a stationary collar 65 and a spring 66 extends between collar 65 and pillow block 63. Accordingly, movement of carriage 56 away from pillow block 63 compresses spring 66. As is known to those skilled in the art, the compression of spring 66 is linearly proportional to the compressive force therein. Thus, the movement of shaft 59 and the compression of spring 66 is directly proporational to the tension force in cable assembly 43.

In order to provide said output proportional to the compression of spring 66 and the tension force in cable assembly 30, sensing means 55 includes a sensor 67 having an electrical output terminal 68 and a movable arm 69. Sensor 67 may be a conventional potentiometer. Arm 69 is connected to shaft 59. Accordingly, movement of shaft 59 causes movement of arm 69, providing an output terminal 68 an electrical signal proportional to the tension force in cable assembly 30.

Referring now to FIG. 8, welding machine 10 includes input means 70 for establishing a predetermined, desired force between electrodes 11 and 12 and terminal 15 and for generating an electrical signal on a line 71 proportional thereto. Input means 70 may also be a potentiometer having a manually movable arm 72 connected to output lead 71. The opposite ends of potentiometers 67 and 70 may be connected to ground and a source of DC voltage, V+.

The electrical signal on line 68 is directly proportional to the position of movable carriage 56 and the actual force in cable assembly 30 whereas the electrical signal on line 71 indicates the force that is desired in cable assembly 30. These signals are applied as the two inputs of a comparator circuit 73 which may be simply an operational amplifier. The output of comparator 73 on a line 74 is a position error signal indicative of the difference between the desired position of carriage 56 and the actual position of carriage 56. In the simplest embodiment of the present invention, this signal may be applied to a driver circuit 75 for activating motor 46 in a direction which will reduce this signal to zero. However, as a practical matter, it is desirable to add additional control to the operation of motor 46.

Accordingly, also included is a tachometer 76 which provides, on an output line 77, a signal which is directly proportional to the velocity of motor 46. The output signal from comparator 73 on line 74 is utilized as a velocity command signal and compared to the actual velocity signal on line 77 in a comparator 78 to provide a velocity error on an output line 79.

The current through motor 46 is sensed by a resistor 80 in series therewith and the junction between motor 46 and resistor 80 is connected via a line 81 to an amplifier 82. Amplifier 82 converts the motor current signal into a voltage and the output of amplifier 82 on a line 83 is compared with the signal on line 79 in a comparator 84, the output of which on a line 85 is conducted to driver 75.

In operation, comparators 78 and 84 operate to control the speed and current through motor 46. By way of example, the signal output on line 74 from comparator 73 may be limited to five volts and is defined as the position error signal. Assuming that the differences in the signals on lines 68 and 71 are sufficient, the output on line 74 would initially be five volts. Assume also that it is desired to run motor 46 at 2,000 RPM and that tachometer 76 will produce a voltage of five volts on line 77 at this speed. Initially, when motor 46 is stationary, the output on line 77 is zero so that comparator 78 will see a difference voltage of five volts. The output of comparator 78 is also limited to five volts as is the output of comparator 84. Comparator 84 applies its output signal to driver 75 which applies 10 amps to motor 46 which begins to accelerate. Motor 46 will continue to accelerate until tachometer 76 reaches a speed which is sufficiently close to 2,000 RPM that its voltage starts to increase to a point close to the voltage of the signal on line 74. This reduces the difference signal which comparator 78 sees, which lowers the signal on line 79 to reduce the current applied by driver 75 to motor 46. Thus, the current to motor 46 will begin to reduce as it reaches 2,000 RPM.

Motor 46 will continue to operate in this stable condition until carriage 49 tightens cable assembly 30 to a point where a tension force is being applied thereto. Feedback through amplifier 82 and comparator 84 will increase motor current due to the force required to compress spring 66. Any tendency to reduce the speed of motor 46 will also be sensed by tachometer 76 to provide an additional feedback signal to control the motor current and to keep the desired velocity at 2,000 RPM. This procedure will continue, increasing the tension force in cable assembly 30 and compressing spring 66 until the signal on line 68 begins to approach the signal on line 71. This starts to decrease the position error signal on line 74 which is interpreted by comparator 78 as a signal to decrease the velocity which is interpreted by comparator 84 as a command to decrease the motor current to slow motor 46. This procedure continues until the signals on line 68 and 71 are equal so that the output on line 74 is zero and until the output on line 77 is also zero indicating that the motor has stopped and motor 46 ceases operation.

It can therefore be seen that welding machine 10 provides a repeatable, accurately controllable welding force through the use of an electro-mechanical actuator mechanism. Welding machine 10 does not attempt to apply an established force to electrodes 11 and 12. Rather, welding machine 10 utilizes a motor 46 to apply a force to cable assembly 30 which applies the force to electrodes 11 and 12 and sensing means 45 continuously and accurately senses the force being applied. The difference between the desired force, as established by potentiometer 70, and the actually applied force, as sensed by potentiometer 67, is utilized to continuously control motor 46. The feedback loop shown in FIG. 8 not only senses position error but velocity error and motor current to control motor 46.

The force applied by welding machine 10 to electrodes 11 and 12 is readily adjustable over a wide range and can be sequenced in any order. The electronics shown in FIG. 8 may be conveniently positioned in a suitable housing 90 and one or more potentiometers, such as potentiometer 70 may be positioned on a control panel 91. A foot pedal 92 may be connected between electronics 90 and control panel 91 to sequence different potentiometers at different intervals to control the force between electrodes 11 and 12 and terminal 15.

The present system provides more accuracy, more uniformity, and more flexibility than systems known heretofore. For example, the present system does not require an external supply of compressed air with the attendant pressure fluctuation and filtration problems involved in existing pneumatic systems. Electrodes 11 and 12 can be controlled both in velocity and force and they interface easily with existing electronic control systems.

While the invention has been described with respect to a preferred physical embodiment constructed in accordance therewith, it will be apparent to those skilled in the art that various modifications and improvements may be made without departing from the scope and spirit of the invention. Accordingly, it is to be understood that the invention is not to be limited by the specific illustrative embodiment, but only by the scope of the appended claims.

I claim:

1. A welding machine for welding a conductor to a terminal comprising:
    a pair of elongated conductive electrodes having adjacent ends mounted for axial movement toward said terminal;
    a cable;
    means for attaching said cable to said electrodes for moving same toward said terminal;
    drive means operatively connected to said cable for applying a tension force thereto;
    input means for establishing a predetermined force between said electrodes and said terminal and for generating a first electrical signal proportional thereto;

sensing means operatively coupled to said cable for sensing the tension force therein and for generating a second electrical signal proportional thereto;

comparison means for comparing said first and second signals and for generating a third electrical signal as a function of said comparison; and control means responsive to said third signal for controlling said drive means.

2. A welding machine according to claim 1, wherein said electrodes are mounted for movement toward and away from each other, with said terminal between said adjacent ends, and wherein the opposite ends of said cable are connected to said electrodes.

3. A welding machine according to claim 2, wherein said drive means is connected to an intermediate portion of said cable.

4. A welding machine according to claim 3, wherein said sensing means is connected to an intermediate portion of said cable.

5. A welding machine according to claim 1, wherein said drive means comprises:

a motor having a rotatable output shaft; and means operatively connecting said output shaft to said cable.

6. A welding machine according to claim 5, wherein said motor output shaft comprises a drive screw and wherein said means operatively connecting said shaft to said cable comprises:

a movable carriage a pulley mounted on said carriage, said cable extending around said pulley; and linkage means interconnecting said drive screw and said carriage for movement of said carriage toward and away from said motor upon rotation of said drive screw.

7. A welding machine according to claim 1, wherein said sensing means comprises:

a movable carriage a pulley mounted on said movable carriage, said cable engaging said pulley for movement of said carriage as the tension in said cable increases;

a fixed pillow block;

a spring positioned between said carriage and said pillow block so that said spring is compressed as the tension in said cable increases;

a sensor having an electrical output terminal and a movable arm; and means connecting said movable arm to said movable carriage whereby said output terminal produces said second electrical signal.

8. A welding machine according to claim 7, wherein said sensor comprises a potentiometer.

9. A welding machine according to claim 1, further comprising:

a tachometer operatively coupled to said motor for sensing the speed thereof and for generating a fourth electrical signal proportional thereto; and comparison means for comparing said third and fourth electrical signals and for generating a fifth electrical signal, said fifth electrical signal controlling said drive means.

10. A welding machine according to claim 9, wherein said control means further comprises:

means for sensing the current through said drive means and for generating a sixth electrical signal as a function thereof; and comparison means for comparing said fifth and sixth signals and generating a seventh electrical signal as a function thereof, said seventh electrical signal controlling said drive means.

11. A welding machine according to claim 1, wherein said control means operates said drive means to increase the tension in said cable until said third electrical signal is reduced to zero.

* * * * *